United States Patent [19]

Wada et al.

[11] 4,277,703
[45] Jul. 7, 1981

[54] MONOSTABLE MULTIVIBRATOR CIRCUIT WITH CLAMPED NON-SATURATING COMMON EMITTER AMPLIFIER IN FEEDBACK PATH

[75] Inventors: Takeshi Wada; Masanori Ienaka, both of Kodaira; Yukihiko Miyamoto; Tsuneo Yamada, both of Tokyo, all of Japan

[73] Assignees: Hitachi, Ltd.; Trio Kabushiki Kaisha, both of Tokyo, Japan

[21] Appl. No.: 2,108

[22] Filed: Jan. 9, 1979

[30] Foreign Application Priority Data

Mar. 15, 1978 [JP] Japan .................. 53-28661

[51] Int. Cl.³ ................... H03K 5/08; H03K 3/033
[52] U.S. Cl. ................... 307/553; 307/246; 307/280; 307/273; 330/254
[58] Field of Search ............... 307/553, 237, 273, 280, 307/246; 329/128; 330/254

[56] References Cited

U.S. PATENT DOCUMENTS

| | | | |
|---|---|---|---|
| 3,124,706 | 3/1964 | Alexander | 307/273 X |
| 3,755,693 | 8/1973 | Lee | 307/280 X |
| 3,828,206 | 8/1974 | Zuk | 307/280 X |
| 3,883,756 | 5/1975 | Dragon | 307/273 X |

*Primary Examiner*—John S. Heyman
*Attorney, Agent, or Firm*—Craig & Antonelli

[57] ABSTRACT

This invention relates to a monostable multivibrator which is operated in the non-saturated state. The monostable multivibrator circuit includes a time constant circuit which has a capacitor, an amplifier circuit which receives an output signal of the time constant circuit, a positive feedback circuit which is connected between an output end of the amplifier circuit and an input end of the time constant circuit, and a trigger terminal which is disposed in a circuit loop constructed of the time constant circuit, the amplifier circuit and the positive feedback circuit; and it is characterized in that the positive feedback circuit comprises a signal amplifying transistor which has a base receiving an output of the amplifier circuit and a collector supplying a signal to the time constant circuit, and a level clamp circuit which is coupled to the collector of the transistor in order to hold a collector output potential of the transistor higher than a base input potential thereof.

3 Claims, 10 Drawing Figures

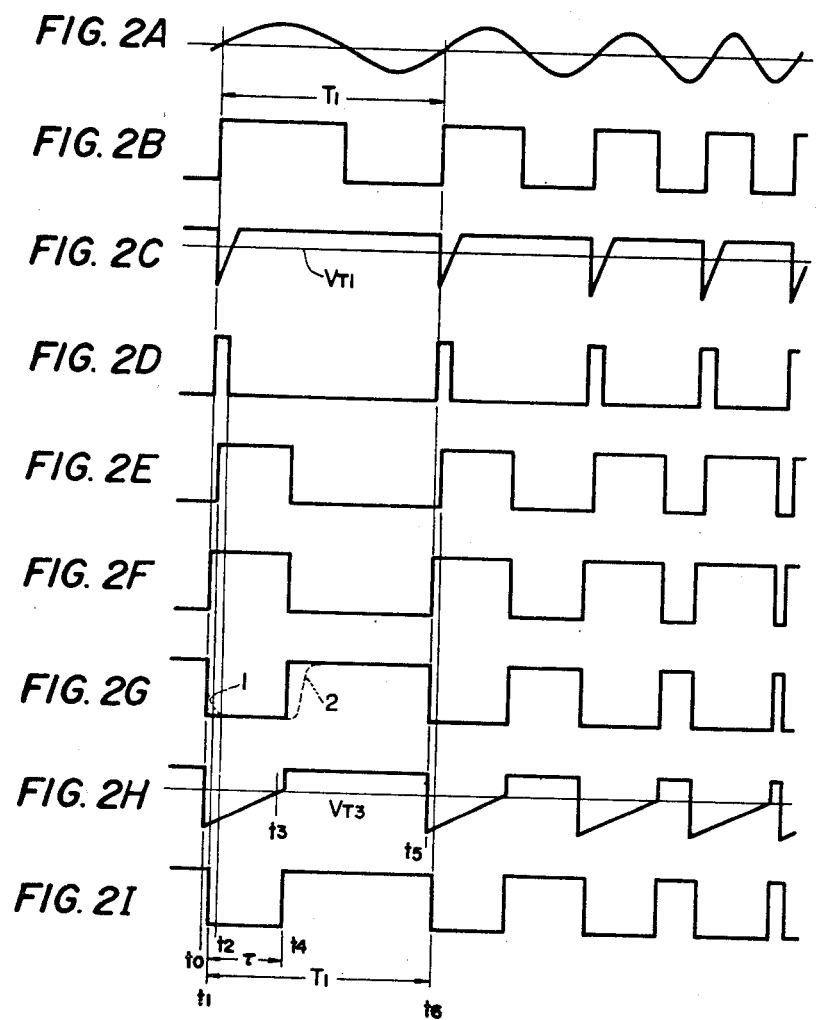

MONOSTABLE MULTIVIBRATOR CIRCUIT WITH CLAMPED NON-SATURATING COMMON EMITTER AMPLIFIER IN FEEDBACK PATH

BACKGROUND OF THE INVENTION

This invention relates to monostable multivibrator circuits. More particularly, it relates to a monostable multivibrator circuit of the non-saturated type in which a signal amplifying transistor constituting the monostable multivibrator circuit operates in a non-saturated state.

A signal amplifying transistor in a monostable multivibrator circuit effects saturated operation when its collector potential has become lower than its base potential. At such time the current gain of the transistor lowers, and the change of the collector current responsive to the change of an input signal becomes small. Therefore, a current of an abrupt change corresponding to the input signal cannot be applied to a load of the transistor, and the rectangular waveform of an output signal becomes rounded. On account of the saturation, carriers are accumulated in a collector region and a base region of the transistor, so that the delay time of the output signal becomes comparatively long.

In order to avoid the drawbacks, the signal amplifying transistor may be operated in the non-saturated state by setting the lowest value of the collector potential to be higher than the base potential in advance. In this case, the output signal presents a favorable change free of influences by the lowering of the current gain or the accumulation of the carriers as described above.

However, in case where the signal amplifying transistor is operated in the non-saturated state in this manner, the operating range is determined by the characteristics of circuit elements, and hence, the circuit operation is greatly affected by dispersions in the characteristics of the circuit elements.

In semiconductor integrated circuits, the dispersions of the circuit elements are comparatively wide. When considering the construction of the monostable multivibrator with a semiconductor integrated circuit, therefore, it is feared that the saturated operation will occur due to the dispersions even when the constants of the circuit elements are set so as to establish the non-saturated operation.

SUMMARY OF THE INVENTION

It is accordingly an object of this invention to provide a monostable multivibrator circuit of non-saturated operation which is less susceptible to influences by dispersions in the characteristics of circuit elements.

Another object of this invention is to provide a monostable multivibrator circuit which is suitably assembled in, for example, a semiconductor linear integrated circuit.

In this invention, a clamp circuit which limits the lowest value of the collector potential of a signal amplifying transistor is connected to the collector of the transistor. In consequence, even when variations ascribable to dispersions in the characteristics of circuit elements have developed in the collector load resistance, the collector current, the base potential, etc., the lowest value of the collector potential is held higher than the base potential.

A monostable multivibrator circuit is constructed of a circuit loop which consists of a time constant circuit including a capacitor, an amplifier circuit receiving an output of the time constant circuit, and a positive feedback circuit connected between an output end of the amplifier circuit and an input end of the time constant circuit. The output pulse width of this monostable multivibrator circuit is determined by the characteristics of the time constant circuit. Accordingly, the circuit which uses the transistor with the clamp circuit connected thereto is disposed at least on the input side of the time constant circuit.

Hereunder, this invention will be described in detail in conjunction with an embodiment.

BRIEF DESCRIPTION OF THE DRAWINGS

FIGS. 2A to 2I are diagrams of operating waveforms in the embodiment of this invention shown in FIG. 1.

DESCRIPTION OF THE PREFERRED EMBODIMENT

Figure 1:
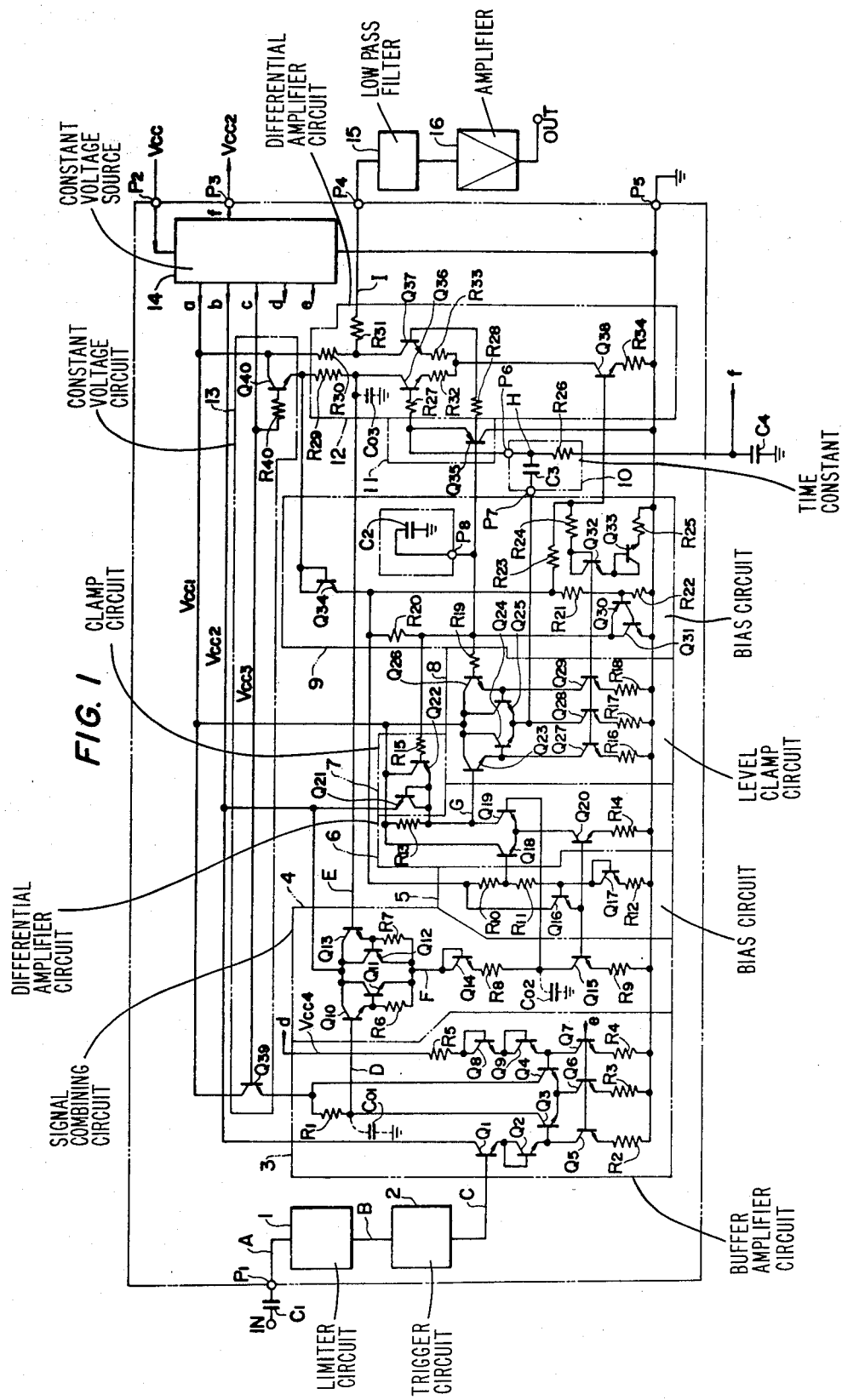
FIG. 1 is a circuit diagram showing an embodiment in which the monostable multivibrator of this invention is applied to an FM detector circuit of the pulse count system.

FIG. 1 shows a monostable multivibrator circuit of an embodiment in the state in which it is used in an FM detector circuit of a pulse count system.

Referring to the figure, numeral 1 designates a limiter circuit, numeral 2 a trigger signal forming circuit, numeral 3 a buffer amplifier circuit which executes an amplitude limiting operation, and numeral 4 a signal combining circuit. Numerals 5 and 9 designate bias supplying circuits, and numerals 6 and 12 differential amplifier circuits. Numeral 7 indicates a level clamp circuit, numeral 8 a differentiator driver and level clamp circuit, numeral 10 a time constant circuit, and numeral 11 a differentiator output clamp circuit. Shown at 13 and 14 are constant-voltage circuits.

In the above, the circuits 4 to 12 constitute the monostable multivibrator circuit.

A portion enclosed with a one-dot chain line in the figure is put into a semiconductor integrated circuit (IC). $P_1$ to $P_5$ represent external terminals of the IC.

Signal waveforms at positions A to I in the circuit are respectively illustrated in FIGS. 2A to 2I.

An FM signal which has been broadcast and received and which has been converted into an intermediate frequency of comparatively low frequency is applied to the terminal $P_1$ through a terminal IN as well as a coupling capacitor $C_1$.

This FM signal is waveform-shaped by the limiter circuit 1 in order to obtain a trigger signal later. The limiter circuit 1 amplifies the input FM signal shown in FIG. 2A, and limits the amplitude of the amplified signal. As illustrated in FIG. 2B, the output signal of the limiter circuit 1 becomes a substantially rectangular signal waveform having the same periods as those of the input FM signal.

The trigger signal forming circuit 2 includes, for example, a waveform shaping circuit composed of resistors and capacitors and an amplifier circuit (neither is shown in the figure). In response to the input rectangular wave signal in FIG. 2B, it provides the trigger signal in synchronism with the rise of the input signal. The output signal waveform of the circuit 2 assumes the shape illustrated in FIG. 2C.

The trigger signal is applied to the buffer amplifier circuit 3. In the buffer amplifier circuit 3, transistors $Q_5$ to $Q_7$ operate as constant-current transistors owing to a base bias voltage fed from the constant-voltage circuit 14.

The trigger signal is applied to the base of one differential transistor $Q_3$ through an emitter follower transistor $Q_1$ and a level shifting transistor in the diode connection $Q_2$ which are connected in series. The quantity of level shift by the transistors $Q_1$ and $Q_2$ is constant because their emitter currents are fixed by the transistor $Q_5$.

An output voltage $V_{CC4}$ of the constant-voltage circuit 14 is applied to the base of the other differential transistor $Q_4$ through a resistor $R_5$ and diode-connected transistors $Q_8$ and $Q_9$ which are connected in series.

The base potential $V_{T1}$ of the other differential transistor $Q_4$ is set at an intermediate value in the level variation range of the trigger signal which is applied to the one differential transistor $Q_3$. The one differential transistor $Q_3$ conducts the "on-off" operation with its threshold voltage being the potential $V_{T1}$.

In response to the input trigger signal shown in FIG. 2C, accordingly, the buffer amplifier circuit 3 provides an inverted signal which is waveform-shaped into a fixed amplitude and duration as illustrated in FIG. 2D.

The trigger signal subjected to the waveform shaping and a feedback signal from the differential amplifier circuit 12 are applied to the signal combining circuit 4.

Transistors $Q_{10}$ and $Q_{11}$ and transistors $Q_{12}$ and $Q_{13}$ of the signal combining circuit 4 are Darlington connected, respectively. The emitters of the transistors $Q_{11}$ and $Q_{12}$ are connected in common, and are connected to the collector of a constant-current transistor $Q_{15}$ through a level shifting transistor in the diode connection $Q_{14}$ and a resistor $R_8$.

The transistors $Q_{10}$ and $Q_{11}$ and those $Q_{13}$ and $Q_{12}$ in the Darlington connections operate as a kind of switching element for two input signals owing to the common connection of the emitters. The potential of the emitters connected in common corresponds to a higher one of the base potentials of the transistors $Q_{10}$ and $Q_{13}$. The transistors in the Darlington connection operate also as a level shift circuit. The quantity of level shift which occurs between the base and the common emitter of the Darlington-connected transistors in the "on" state is equal to the sum of the base-emitter forward voltages of the two transistors. In this case, the emitter current is made constant by the constant-current transistor $Q_{15}$, and hence, the base-emitter forward voltage is constant. Accordingly, the aforecited quantity of level shift is constant irrespective of the level of the input signal applied to the base of the Darlington-connected transistor.

In the circuit of FIG. 1, the signal shown in FIG. 2D is applied to the base of the Darlington-connected transistor $Q_{10}$, and the feedback signal shown in FIG. 2E is applied to the base of the transistor $Q_{13}$. Therefore, a composite signal shown in FIG. 2F appears at the common-connection emitters.

The composite signal is applied to the differential amplifier circuit 6 through a level shift circuit which consists of the diode-connected transistor $Q_{14}$ and the resistor $R_8$. The differential amplifier circuit 6 consists of differential transistors $Q_{18}$ and $Q_{19}$, a constant-current transistor $Q_{20}$ and a load resistor $R_{13}$, and it inverts and amplifies the entered composite signal. An output signal at an output terminal of the differential amplifier circuit 6 has its high level and low level limited by the clamp circuit 7. Since, in the clamp circuit 7, the emitter of a transistor $Q_{21}$ is connected to an output terminal b of the constant-voltage circuit 14, the high level is determined by a voltage $V_{CC2}$ and the base-emitter forward voltage of the transistor $Q_{21}$. Since the base of a transistor $Q_{22}$ receives a constant voltage from the bias supplying circuit 9 through a resistor of comparatively small resistance $R_{15}$, the low level is determined by the constant voltage and the base-emitter forward voltage of the transistor $Q_{22}$. The voltage $V_{CC2}$ has a value lower than a supply voltage $V_{CC1}$ of the differential amplifier circuit 6.

The collector potential of the transistor $Q_{19}$ at the time when this transistor has attained the conductive state varies depending on the dispersion of the load resistance $R_{13}$, the dispersion of the collector current of the constant-current transistor $Q_{20}$, etc.

The low clamp level owing to the transistor $Q_{22}$ is made a comparatively high level at which, even when the collector potential of the differential transistor $Q_{19}$ has varied as stated above, its minimum value is not lower than the base potential of the transistor. As a result, the differential transistor $Q_{19}$ is prevented from operating in the saturated state even if the variation has occurred. The other differential transistor $Q_{18}$ has its collector connected directly to a power supply terminal a of the voltage $V_{CC1}$ and held at a fixed high potential, so that it does not conduct the saturated operation.

The differential amplifier circuit 6 provides an inverted signal as shown in FIG. 2G at its output terminal in response to the input signal shown in FIG. 2F.

The changing rate of the output signal of the differential amplifier circuit 6 at the rise thereof is limited by the time constant between the load resistor $R_{13}$ and an output capacitance (not shown) including the collector capacitance of the transistor $Q_{19}$, a wiring capacitance, etc. In particular, the changing rate decreases as the potential of the output terminal becomes closer to the supply voltage $V_{CC1}$.

The portion of the low rate of change is removed from the output signal by the clamping of the high level of the output signal.

In case where the lower limit of the collector potential is not set, the transistor $Q_{19}$ will operate in the saturated state when the collector potential has become lower than the base potential in response to the input signal. Since the current gain of the transistor becomes small in the saturated state, the output signal waveform will become rounded as indicated by a broken line 1 in FIG. 2G. Besides, it lags as indicated by a broken-line curve 2 in FIG. 2G on account of the accumulation of carriers in the base and the collector.

The output signal of the differential amplifier circuit 6 is applied to the differentiator driver circuit which has emitter-follower transistors $Q_{23}$ and $Q_{24}$ in the Darlington connection. The differentiator driver circuit has a clamp circuit which is composed of transistors $Q_{25}$ and $Q_{26}$. The lower-limit level of the emitter potential of the transistor $Q_{24}$ is limited by this clamp circuit.

An output signal from the buffer amplifier circuit 8 is applied through an external terminal $P_7$ to the time constant circuit 10 which is composed of a capacitor $C_3$ and a resistor $R_{26}$. An output signal from the time constant circuit is applied to the differential amplifier circuit 12 through an external terminal $P_6$ as well as the differentiator output clamp circuit 11.

One end of the resistor $R_{26}$ of the time constant circuit 10 is connected to a smoothing capacitor $C_4$ and an output terminal f of the constant-voltage circuit 14. In the stable state of the monostable multivibrator circuit, the base-emitter path of a p-n-p transistor $Q_{35}$ of the differentiator output clamp circuit 11 is forward-biased by a current from the resistor $R_{26}$. Accordingly, the emitter potential of the transistor $Q_{35}$ is higher than the base potential thereof. Owing to the aforecited potentials of the differentiator output clamp circuit 11, a transistor $Q_{36}$ of the differential amplifier circuit 12 is in the "on" state and a transistor $Q_{37}$ thereof is in the "off" state. The minimum values of the collector potentials of the transistors $Q_{36}$ and $Q_{37}$ are held higher than the base potentials thereof owing to a limited current fed from a constant-current transistor $Q_{38}$.

The time constant circuit 10 provides a signal shown in FIG. 2H, and the differential amplifier circuit 12 delivers a signal shown in FIG. 2I to its output terminal I.

In this embodiment, the collector of the transistor $Q_{37}$ of the differential amplifier circuit 12 is especially connected through the load resistor $R_{30}$ to that output terminal a of the constant-voltage circuit 14 which provides the voltage $V_{CC1}$ still higher than the voltages $V_{CC2}$ and $V_{CC3}$. Therefore, the resistance of the load resistor $R_{30}$ can be selected so as to operate the transistor $Q_{37}$ in the nonsaturated state, and the amplitude of the output signal at the output terminal I can be made large. This makes it possible to easily supply a desired voltage to a circuit 15 which utilizes the detector circuit. Furthermore, this optimizes the operating condition of the transistor $Q_{36}$. More specifically, since the collector output voltage (the voltage at the terminal E) of the transistor $Q_{36}$ having the time constant circuit 10 as its input circuit may be a small voltage enough to drive a positive feedback circuit (for example, 1/10 of the voltage at the terminal I), the transistor $Q_{36}$ can be operated in a sufficiently unsaturated state. As a result, even when the base input voltage of the transistor $Q_{36}$ becomes high in the transient state at the turn-on of the transistor $Q_{36}$, it does not rise above the collector voltage of the transistor $Q_{36}$ and does not bring the transistor $Q_{36}$ into saturated operation.

In this manner, it is very effective to derive the output voltage from the transistor $Q_{37}$ opposite to the transistor $Q_{36}$ having the time constant circuit 10 as its input circuit.

In the bias supplying circuit 9, a capacitor $C_2$ which is disposed between a terminal $P_8$ and an earth point of the circuit serves for smoothing.

In the arrangement described above, on the basis of the rise of the trigger signal shown in FIG. 2D which is applied to the base of the transistor $Q_{10}$ of the signal combining circuit 4, the input signal of the time constant circuit 10 falls at a time $t_0$, and the output signal thereof falls upon the decay of this input signal.

Owing to the output signal of the time constant circuit 10, the base potential of the transistor $Q_{36}$ of the differential amplifier circuit becomes lower than the base potential of the transistor $Q_{37}$, so that the transistor $Q_{36}$ changes from the "on" state to the "off" state and the transistor $Q_{37}$ from the "off" state to the "on" state. Accordingly, the collector potential of the transistor $Q_{36}$ becomes the high level. The potential of this high level is supplied to the combining circuit 4. In consequence of a feedback through the circuits 4, 6 and 8, the input signal of the time constant circuit 10 remains at the low level as long as the transistor $Q_{36}$ of the differential amplifier circuit 12 is in the "off" state.

The capacitor $C_3$ of the time constant circuit 10 is charged through the resistor $R_{26}$ from the constant-voltage circuit 14. Therefore, the potential of the output terminal of the time constant circuit 10 increases as shown in FIG. 2H according to a time constant thereof.

The base potential of the transistor $Q_{36}$ of the differential amplifier circuit 12 exceeds the base potential of the transistor $Q_{37}$ at a time $t_3$ owing to the output potential of the time constant circuit 10.

As a result, the transistor $Q_{36}$ returns to the "on" state again. Upon the increase of the collector potential of the transistor $Q_{36}$, the input signal of the time constant circuit 10 rises at a time $t_4$ through the circuits 4, 6 and 8.

Upon the rise of the input signal of the time constant circuit 10, the output signal thereof rises. In this case, the output signal is limited by the transistor $Q_{35}$ because the base-emitter path of the transistor $Q_{35}$ of the differentiator output clamp circuit 11 is forward-biased by this signal. Since the emitter terminal of the transistor $Q_{35}$ comes to exhibit a sufficiently low impedance, charges stored in the capacitor $C_3$ of the time constant circuit 10 are rapidly discharged through the transistor $Q_{35}$.

The monostable multivibrator circuit consisting of the circuits 4 to 12 conducts the same operation as above described in response to the next trigger signal.

In the circuit of FIG. 1, the monostable multivibrator circuit provides a pulse signal of a fixed duration as indicated in FIG. 2I every period of the FM signal shown in FIG. 2A.

This signal is impressed on the terminal $P_4$ and the low-pass filter circuit 15. A demodulated signal is obtained from the low-pass filter circuit 15. The demodulated signal is amplified by an amplifier circuit 16.

In this embodiment, the trigger signal and the feedback signal are combined through the emitter-follower transistors, so that the electrical interference between the feedback signal terminal and the trigger signal terminal decreases to a negligible extent. Since the trigger terminal receives only the signal from the buffer amplifier circuit 3 and this signal does not undergo any level change due to the interference, the signal stably triggers the monostable multivibrator even in a different trigger period. The feedback terminal receives only the signal from the differential amplifier circuit 12, and this signal is not interfered with from the trigger terminal etc. Accordingly, the differential amplifier circuit 12 does not cause any distortion ascribable to the interference of the trigger signal.

In contrast, in case where, for example, the trigger terminal is interfered with by the feedback terminal, the level of the trigger terminal is at the high level during the period during which the level of the feedback terminal is at the high level, and it attains the low level when the feedback terminal has attained the low level. In this case, the change of the signal at the trigger terminal is limited by a stray capacitance $C_{01}$ of this trigger terminal, i.e., the output terminal of the buffer amplifier circuit, and hence, the signal level having appeared at the trigger terminal on account of the interference does not immediately decrease. As a result, when the trigger signal period differs, the trigger level changes because the signal level having been caused at the trigger terminal by the interference differs.

In this embodiment, the interference with the feedback terminal by the trigger terminal is diminished by the combining circuit as described previously. As illustrated in FIG. 1, the output terminal of the monostable multivibrator circuit is connected to the collector of the differential transistor $Q_{37}$, and it is separated from the feedback terminal. Accordingly, the trigger signal does not leak to the output terminal through the feedback terminal.

The emitter-follower transistors of the combining circuit 4 have sufficiently low output impedances, and can accordingly make the rising rate of the composite signal sufficiently high. In case where the trigger terminal and the feedback terminal are directly connected, stray capacitances $C_{01}$ to $C_{03}$ including the collector capacitances of the transistors $Q_3$, $Q_{15}$ and $Q_{36}$, etc. will be combined at the direct connection point and will give a comparatively large value. The emitter-follower transistors of the combining circuit 4 make the capacitances independent of one another. Therefore, the respective capacitances of the trigger terminal and the feedback terminal remain small, and the signal changes at these terminals can be made sufficiently rapid.

The construction of the clamp circuit in the monostable multivibrator circuit of this invention can be altered. By way of example, the transistor $Q_{22}$ can be replaced with a diode.

What is claimed is:

1. A monostable multivibrator circuit including a time constant circuit which includes a capacitor, an amplifier circuit which receives an output signal of the time constant circuit, a positive feedback circuit which is connected between an output end of the amplifier circuit and an input end of the time constant circuit, and a trigger terminal which is disposed in a circuit loop constructed of the time constant circuit, the amplifier circuit and the positive feedback circuit, characterized in that said positive feedback circuit comprises a signal amplifying transistor which has a base receiving an output of said amplifier circuit, a collector supplying a signal to said time constant circuit and an emitter connected to an emitter of another transistor in common, to constitute a differential amplifier circuit, and a level clamp circuit which is coupled to said collector of said signal amplifying transistor in order to hold a collector output potential of said signal amplifying transistor higher than a base input potential thereof.

2. A monostable multivibrator circuit according to claim 1, wherein said level clamp circuit comprises diode means which is inserted between a power source having a fixed potential higher than the base input potential and said collector of said transistor, so as to be forward-biased when said transistor turns "on".

3. A monostable multivibrator circuit according to any one of claims 1 or 2, wherein said amplifier circuit is made up of a differential amplifier in which emitters of a pair of transistors are connected in common, said time constant circuit is coupled to a base of one of said pair of transistors, said positive feedback circuit is coupled to a collector of said one transistor, and an output of said monostable multivibrator circuit is derived from a collector of the other of said pair of transistors.

* * * * *